(12) United States Patent
Kumakura et al.

(10) Patent No.: US 11,139,169 B2
(45) Date of Patent: Oct. 5, 2021

(54) ETCHING METHOD AND ETCHING APPARATUS

(71) Applicant: TOKYO ELECTRON LIMITED, Tokyo (JP)

(72) Inventors: Sho Kumakura, Miyagi (JP); Satoshi Ohuchida, Miyagi (JP); Maju Tomura, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 16/902,209

(22) Filed: Jun. 15, 2020

(65) Prior Publication Data

US 2020/0402800 A1 Dec. 24, 2020

(30) Foreign Application Priority Data

Jun. 24, 2019 (JP) .............................. JP2019-116471

(51) Int. Cl.
*H01L 21/033* (2006.01)
*H01L 21/67* (2006.01)
*H01L 21/311* (2006.01)

(52) U.S. Cl.
CPC .... *H01L 21/0338* (2013.01); *H01L 21/31116* (2013.01); *H01L 21/31144* (2013.01); *H01L 21/67069* (2013.01)

(58) Field of Classification Search
None
See application file for complete search history.

(56) References Cited

U.S. PATENT DOCUMENTS 9,048,192 B2 * 6/2015 Kim .................. H01L 21/30655

FOREIGN PATENT DOCUMENTS

JP          H11-016885 A          1/1999

* cited by examiner

*Primary Examiner* — Roberts P Culbert
(74) *Attorney, Agent, or Firm* — Rothwell, Figg, Ernst & Manbeck, P.C.

(57) ABSTRACT

An etching method and an etching apparatus improve the shape of a mask deformed by an etching process. The etching method for etching a film with plasma includes a step of providing a substrate, an etching step, and a correction step. In the step of providing a substrate, a substrate having a mask formed on a first film is provided. In the etching step, the first film is etched with plasma generated from a first gas containing Xe, Kr, or Rn so that an aspect ratio of a hole or a groove formed in the first film is 30 or more. In the correction step, the shape of the mask is corrected with plasma generated from a second gas.

10 Claims, 4 Drawing Sheets

ETCHING METHOD AND ETCHING APPARATUS

CROSS-REFERENCE TO RELATED APPLICATIONS

This application is based on and claims priority from Japanese Patent Application No. 2019-116471 filed on Jun. 24, 2019 with the Japan Patent Office, the disclosure of which is incorporated herein its entirety by reference.

TECHNICAL FIELD

The embodiments discussed herein are related to an etching method and an etching apparatus.

BACKGROUND ART

An etching gas capable of generating a halogen-based chemical species and an inert gas-based chemical species heavier than argon has been widely used in etching of a silicon-based material layer.

Examples of related art include JP-A-11-016885.

SUMMARY

The disclosure provides an etching method capable of improving the shape of the mask and an etching apparatus therefor.

An etching method for etching a film with plasma according to an aspect of the disclosure includes a step of preparing a substrate, an etching step, and a correction step. In the step of preparing a substrate, a substrate having a mask formed on a first film is prepared. In the etching step, the first film is etched with plasma of a first gas containing Xe, Kr or Rn so that an aspect ratio of a hole or a groove formed in the first film is 30 or more. In the correction step, the shape of the mask is corrected with plasma of a second gas.

According to the disclosure, the shape of the mask may be improved.

DESCRIPTION OF EMBODIMENTS

In the following detailed description, reference is made to the accompanying drawings, which form a part hereof. The illustrative embodiments described in the detailed description, drawings, and claims are not meant to be limiting. Other embodiments may be utilized, and other changes may be made without departing from the spirit or scope of the subject matter presented here.

Hereinafter, embodiments of an etching method and an etching apparatus disclosed will be described in detail with reference to the drawings. Meanwhile, the present embodiment does not limit the disclosed technique.

When etching is performed using the anisotropy of heavy ions while using an inert gas-based chemical species (e.g., Kr, Xe, Rn, etc.) having a mass greater than that of Ar, a mask may be seriously damaged and deformed so that openings may be clogged. Thus, there is a need to improve the shape of the deformed mask.

Overall Configuration of Etching Apparatus 10

Figure 1:
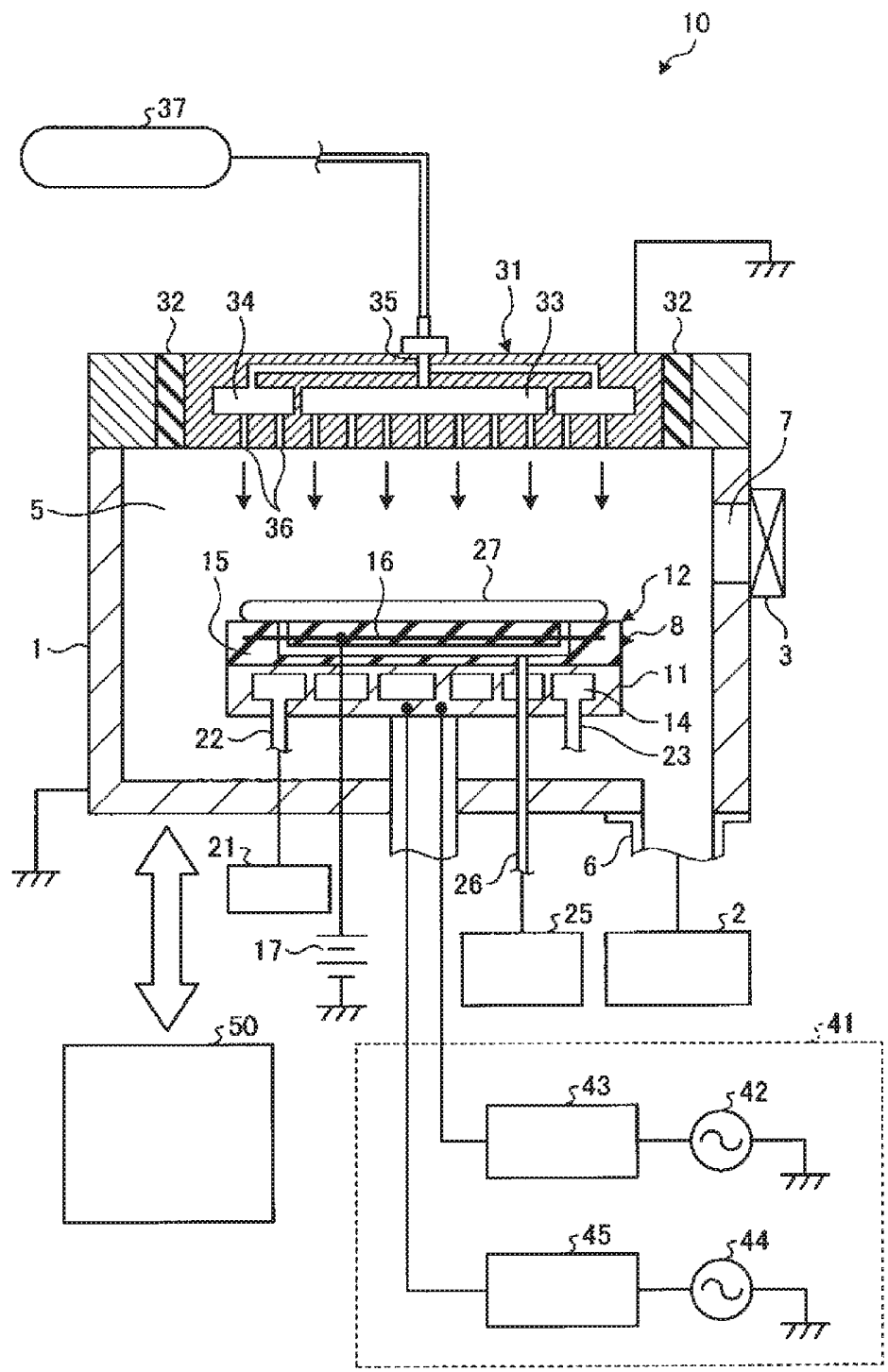
FIG. 1 is a longitudinal sectional view illustrating an example of an etching apparatus according to the present embodiment.

FIG. 1 is a longitudinal sectional view illustrating an example of an etching apparatus according to the present embodiment. An etching apparatus 10 illustrated in FIG. 1 is a capacitively coupled plasma processing apparatus. The etching apparatus 10 includes a chamber 1, an exhaust device 2, and a gate valve 3. The chamber 1 is made of, for example, aluminum. The chamber 1 is formed in a cylindrical shape and has a surface that is subjected to alumite treatment (anodized). The chamber 1 is electrically grounded. A processing space 5 is formed inside the chamber 1. The chamber 1 isolates the processing space 5 from the outside atmosphere. An exhaust port 6 and an opening portion 7 are further formed in the chamber 1. The exhaust port 6 is formed in a bottom part of the chamber 1. The opening portion 7 is formed in a side wall of the chamber 1. The exhaust device 2 is connected to the processing space 5 of the chamber 1 through the exhaust port 6. The exhaust device 2 exhausts gas from the processing space 5 through the exhaust port 6. The gate valve 3 opens or closes the opening portion 7.

The etching apparatus 10 further includes a substrate support 8. The substrate support 8 is disposed in the processing space 5 and is installed at a bottom of the chamber 1. The substrate support 8 includes a support base 11 and an electrostatic chuck 12. The support base 11 is formed of a conductor such as aluminum (Al), titanium (Ti), and silicon carbide (SiC). The support base 11 is supported by the chamber 1. A refrigerant channel 14 is formed inside the support base 11. The electrostatic chuck 12 is disposed on the support base 11. The electrostatic chuck 12 includes an electrostatic chuck body 15 and a chuck electrode 16. The electrostatic chuck body 15 is formed of an insulator. The electrostatic chuck 12 is formed by embedding the chuck electrode 16 inside the electrostatic chuck body 15. The etching apparatus 10 further includes a direct current (DC) voltage source 17. The DC voltage source 17 that is electrically connected to the chuck electrode 16 and supplies a direct current to the chuck electrode 16.

The etching apparatus 10 further includes a chiller 21, a refrigerant inlet piping 22, and a refrigerant outlet piping 23. The chiller 21 is connected to the refrigerant channel 14 via the refrigerant inlet piping 22 and the refrigerant outlet piping 23. The chiller 21 adjusts a temperature of a cooling medium such as water and brine. The chiller 21 circulates the cooling medium through the refrigerant channel 14 via the refrigerant inlet piping 22 and the refrigerant outlet piping 23, and cools the electrostatic chuck 12 of the substrate support 8.

The etching apparatus 10 further includes a heat transfer gas supply source 25 and a heat transfer gas supply line 26. The heat transfer gas supply line 26 is formed such that one end is formed on an upper surface of the electrostatic chuck 12. The heat transfer gas supply source 25 supplies a heat transfer gas such as helium (He) gas, and argon (Ar) gas to a space between a wafer 27 placed on the substrate support 8 and the electrostatic chuck 12 through the heat transfer gas supply line 26.

The etching apparatus 10 further includes a gas shower head 31 and a shield ring 32. The gas shower head 31 formed of a conductor has a disk shape. The gas shower head 31 is arranged to face the substrate support 8 such that a lower surface of the gas shower head 31 is substantially parallel to an upper surface of the substrate support 8. The gas shower head 31 is further arranged to close an opening formed in a ceiling of the chamber 1. The shield ring 32 is formed of an insulator. The shield ring 32 covers a peripheral portion of the gas shower head 31. The gas shower head 31 is supported by the chamber 1 via the shield ring 32, so that the gas shower head 31 is insulated from the chamber 1. The gas shower head 31 is electrically grounded. Meanwhile, a variable DC power supply may be connected to the gas shower head 31 to apply a predetermined DC voltage.

The gas shower head 31 is provided with a center-side diffusion chamber 33, an edge-side diffusion chamber 34, a gas inlet 35, and a plurality of gas supply holes 36. The center-side diffusion chamber 33 is formed at the center of the inside of the gas shower head 31. The edge-side diffusion chamber 34 is formed at the edge side of the inside of the gas shower head 31 and is formed between the edge of the gas shower head 31 and the center-side diffusion chamber 33. The gas inlet 35 is formed above the center-side diffusion chamber 33 and the edge-side diffusion chamber 34 of the gas shower head 31, and communicates with the center-side diffusion chamber 33 and the edge-side diffusion chamber 34, respectively. The plurality of gas supply holes 36 are formed below the center-side diffusion chamber 33 and the edge-side diffusion chamber 34 of the gas shower head 31. The plurality of gas supply holes 36 communicate with the center-side diffusion chamber 33 and the edge-side diffusion chamber 34, and communicate with the processing space 5.

The etching apparatus 10 further includes a processing gas supply source 37. The processing gas supply source 37 that is connected to the gas inlet 35 supplies predetermined processing gas to the gas inlet 35. The processing gas contains a plurality of gases. The processing gas is, for example, a mixed gas of a fluorine-containing gas and a rare gas-containing gas including Xe, Kr, or Rn. The processing gas further contains, for example, an oxygen-containing gas. The processing gas may further contain a predetermined compound. Examples of such compound contain a compound containing hydrogen, nitrogen, and chlorine.

The support base 11 of the substrate support 8 is used as a lower electrode, and the gas shower head 31 is used as an upper electrode. The etching apparatus 10 further includes a power supply device 41. The power supply device 41 includes a first radio frequency power supply 42, a first matching device 43, a second radio frequency power supply 44, and a second matching device 45. The first radio frequency power supply 42 is connected to the substrate support 8 via the first matching device 43. The first radio frequency power supply 42 supplies a first radio frequency of a first frequency (e.g., 40 MHz) to the support base 11 of the substrate support 8 with a predetermined power. The first matching device 43 matches a load impedance with an internal (or output) impedance of the first radio frequency power supply 42. The first matching device 43 functions so that the load impedance and the internal impedance of the first radio frequency power supply 42 appear to coincide with each other when plasma is generated in the processing space 5.

The second radio frequency power supply 44 is connected to the substrate support 8 via the second matching device 45. The second radio frequency power supply 44 supplies a second radio frequency power of a second frequency (e.g., 0.4 MHz) lower than the first frequency to the substrate support 8 with a predetermined power. The second matching device 45 matches the load impedance with an internal (output) impedance of the second radio frequency power supply 44. The second matching device 45 functions so that the load impedance and the internal impedance of the second radio frequency power supply 44 appear to coincide when plasma is generated in the processing space 5. Meanwhile, although, in the present embodiment, the first radio frequency is supplied to the substrate support 8, the first radio frequency may be supplied to the gas shower head 31 as well.

The etching apparatus 10 may further include a control unit 50. The control unit 50 may be a computer including a processor, a storage unit, an input device, and a display device. The control unit 50 controls each unit of the etching apparatus 10. An operator may perform a command input operation for managing the etching apparatus 10 using the input device of the control unit 50. Further, the operation status of the etching apparatus 10 may be visualized and displayed on the display device of the control unit 50. Furthermore, the storage unit of the control unit 50 stores a control program for controlling various processes executed in the etching apparatus 10 by the processor, and a recipe data. The processor of the control unit 50 executes the control program and controls each unit of the etching apparatus 10 according to the recipe data, so that a desired processing is executed in the etching apparatus 10.

For example, the control unit 50 controls each unit of the etching apparatus 10 so as to perform an etching method (to be described later). As a detailed example, the control unit 50 performs a step of providing a substrate having a mask formed on a first film. The control unit 50 performs an etching step of etching the first film with the plasma of a first gas containing Xe, Kr or Rn so that an aspect ratio of a hole or a groove formed in the first film is 30 or more. The control unit 50 performs a correction step of correcting the shape of the mask with the plasma generated from a second gas. Here, the etching step and the correction step are performed, for example, under the condition that the temperature of a substrate to be processed having the first film is in a range of −70° C. to 100° C. Further, the etching step and the correction step may be alternately repeated at least one or more times.

Configuration of Wafer 27

Figure 2:
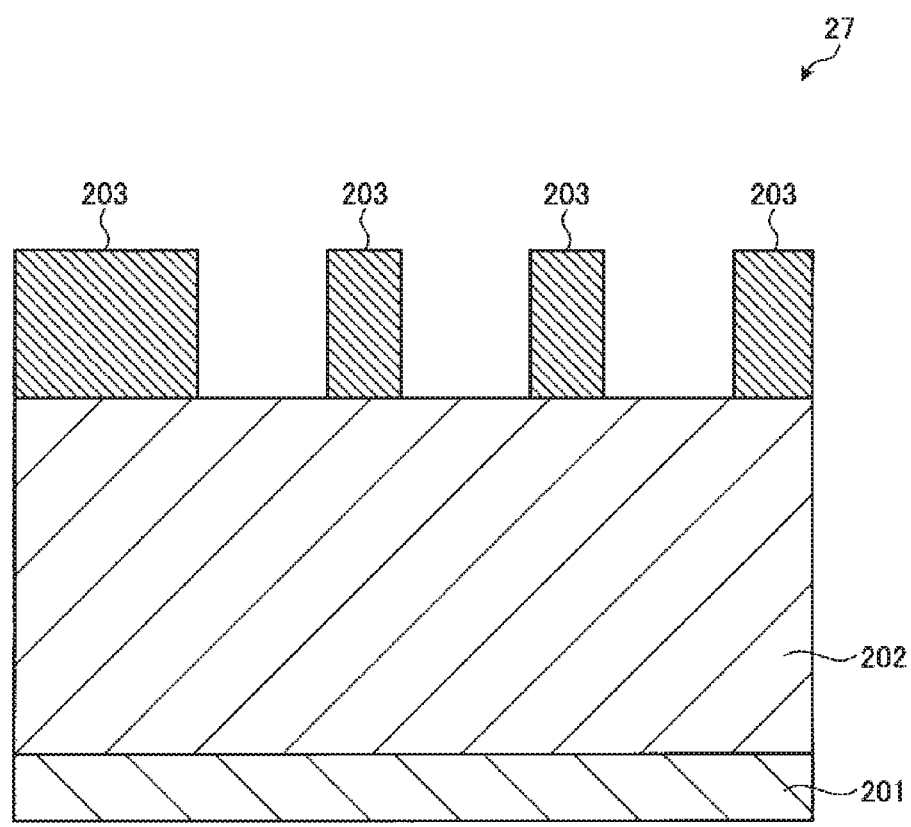
FIG. 2 is a view illustrating an example of a structure of a wafer that is etched by the etching apparatus according to the present embodiment.

FIG. 2 is a view illustrating an example of a structure of a wafer that is etched by the etching apparatus according to the present embodiment.

For example, as illustrated in FIG. 2, the wafer 27 includes a first film 202 on a silicon substrate 201. Further, a mask 203 having openings of a predetermined pattern is formed on the first film 202.

The first film 202 is, for example, a silicon nitride film or an oxide-nitride-oxide-nitride (ONON) film that is a multi-layer film in which a silicon oxide film and a silicon nitride film are alternately stacked. That is, the first film 202 is a film containing a nitride. Further, the first film 202 may be, for example, a silicon oxide film. That is, the first film 202 may contains at least one of $Si_3N_4$ or $SiO_2$.

The mask 203 is, for example, an amorphous carbon film (aC, a-C:H, or ta-C). Further, the mask 203 may be, for example, a metal-based (such as W, Ti, TiN, $TiO_2$, and WC) film.

Etching Method

Figure 3:
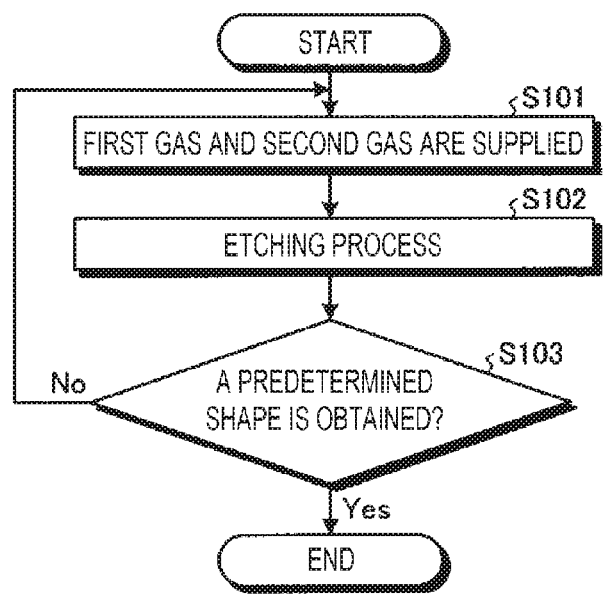
FIG. 3 is a flowchart illustrating an example of an etching method according to the present embodiment.

Next, an etching method according to the present embodiment will be described. FIG. 3 is a flowchart illustrating an example of an etching method according to the present embodiment.

In the etching method according to the present embodiment, first, the control unit 50 opens the opening portion 7 by controlling the gate valve 3. The wafer 27 to be processed is carried into the processing space 5 of the chamber 1 through the opening portion 7 and disposed on the substrate support 8. The control unit 50 applies a DC voltage to the chuck electrode 16 by controlling the DC voltage source 17 after the wafer 27 is disposed on the substrate support 8. The wafer 27 is held on the electrostatic chuck 12 by Coulomb force when the DC voltage is applied to the chuck electrode 16. The control unit 50 further closes the opening portion 7 by controlling the gate valve 3. The control unit 50, when the opening portion 7 is closed, exhausts gas from the processing space 5 so that the atmosphere in the processing space 5 is set to a predetermined degree of vacuum by controlling the exhaust device 2.

The control unit 50, when the wafer 27 is held by the electrostatic chuck 12, supplies a heat transfer gas to a space between the electrostatic chuck 12 and the wafer 27 through the heat transfer gas supply line 26 by controlling the heat transfer gas supply source 25. Further, the control unit 50 circulates the refrigerant having a predetermined temperature through the refrigerant channel 14 and adjusts the temperature of the electrostatic chuck 12 by controlling the chiller 21. At this time, as the heat is transferred from the electrostatic chuck 12 to the wafer 27 through the heat transfer gas supplied to the space between the electrostatic chuck 12 and the wafer 27, the temperature of the wafer 27 is adjusted so that the temperature of the wafer 27 falls within a predetermined temperature range.

The control unit 50 supplies a processing gas having a predetermined composition to the gas inlet 35 by controlling the processing gas supply source 37 when the temperature of the wafer 27 is adjusted to a predetermined temperature. After being supplied to the gas inlet 35, the processing gas is supplied to the center-side diffusion chamber 33 and the edge-side diffusion chamber 34, and diffused into the center-side diffusion chamber 33 and the edge-side diffusion chamber 34. After being diffused into the center-side diffusion chamber 33 and the edge-side diffusion chamber 34, the processing gas is supplied to the processing space 5 of the chamber 1 in the form of a shower through the plurality of gas supply holes 36. That is, the control unit 50 supplies, as the processing gas, the first gas that is an etching gas, and the second gas that is a mask correction gas to the processing space 5 (Step S101).

The control unit 50 supplies a first radio frequency for plasma excitation and a second radio frequency for biasing to the substrate support 8 by controlling the first radio frequency power supply 42 and the second radio frequency power supply 44. When the first radio frequency is supplied to the substrate support 8, plasma is generated in the processing space 5. When the second radio frequency is supplied to the substrate support 8, an ion in the plasma is accelerated toward the wafer 27. The wafer 27 is etched by the plasma generated in the processing space 5.

That is, the control unit 50 performs an etching step of etching the first film 202 with plasma (Step S102). Specifically, the control unit 50 etches the first film 202 with the plasma generated from the processing gas using the mask 203 in the processing space 5. In this etching step, the first film is etched with the plasma generated from the first gas containing Xe, Kr, or Rn so that an aspect ratio of a hole or a groove formed in the first film becomes 30 or more.

Meanwhile, in the above etching step, the second gas is supplied to the processing space 5 at the same time as the first gas, so that a correction step of correcting the shape of the mask 203 with the plasma generated front the second gas is simultaneously performed. In the processing condition applied to the etching step as described above, for example, a mixed gas containing a fluorine-containing gas and a Xe, Kr, or Rn-containing gas is used as the first gas. Further, in the processing condition applied to the etching step described above, for example, an oxygen-containing gas is used as the second gas.

For example, $C_4F_8$ gas, $CH_2F_2$ gas, or $CH_3F$ gas is used as the fluorine-containing gas. As the Xe, Kr, or Rn-containing gas, for example, a gas containing at least one of Xe, $XeF_2$, $XeF_4$, $XeF_6$, $XeO_4$, $XeO_x$, $XeO_2$, $XeO_xY_y$, $XeO_xF_y$, $XeCl_2$, $HXeOXeH$, $XeH_2$, Kr, $KrF_2$, Rn, or $RnF_2$ is used. Meanwhile, the gas containing $XeF_2$, $XeF_6$, $XeO_xF_y$, $KrF_2$, or $RnF_2$ is also a fluorine-containing gas.

As for the oxygen-containing gas of the second gas, for example, $O_2$ gas, $CO_2$ gas, CO gas, $N_2O$ gas, or NO gas is used. Further, the second gas may be a gas capable of removing the amorphous carbon of the mask 203, and may be a nitrogen-containing gas or a hydrogen-containing gas. As for the nitrogen-containing gas, for example, $N_2$ gas, $N_2O$ gas, $NF_3$ gas, $NH_3$ gas, or NO gas is used. As for the hydrogen-containing gas, for example, $NH_3$ gas, or $H_2$ gas is used. Furthermore, the second gas may be a mixed gas of two or more of the oxygen-containing gas, the nitrogen-containing gas and the hydrogen-containing gas. Meanwhile, when the mask 203 is a metal-based film, $Cl_2$ gas or the like is used as for the second gas instead of the oxygen-containing gas, the nitrogen-containing gas, and the hydrogen-containing gas.

The control unit 50 performs the etching step in Step S102, for example, under the following processing conditions.

Pressure in chamber 1: 3.333 Pa (25 mTorr)
First radio frequency power (40 MHz): 4.9 kW
Second radio frequency power (400 kHz): 7.04 kW
Processing gas (first gas): Mixed gas containing $C_4F_8$, $H_2$ and Xe
Processing gas (second gas): Mixed gas containing $H_2$ and $O_2$
Temperature of wafer: −60° C.

In the etching step in Step S102, the first film 202 is etched by the first gas. At this time, although the opening portion on the surface of the mask 203 is deformed by heavy ions such as Xe, the deformed portion of the opening portion of the mask 203 is removed by the second gas (e.g., $O_2$) in the correction step, whereby the shape of the mask is corrected. Meanwhile, $H_2$ may be contained in both the first gas and the second gas. Further, when $H_2$ is contained in one of the first gas and the second gas and not in the other gas, the flow rate of $H_2$ in the one gas may be increased in the correction step.

Figure 4:
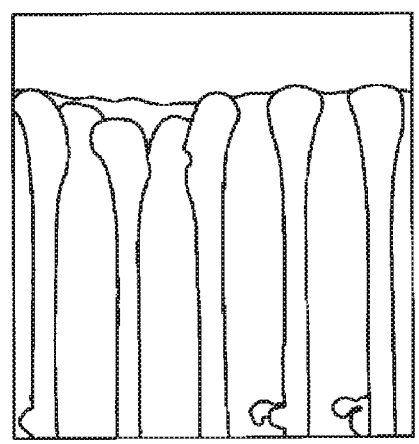
FIG. 4 is a view illustrating an experimental result of a change in the shape of a mask when a second gas is not contained.
Figure 5:
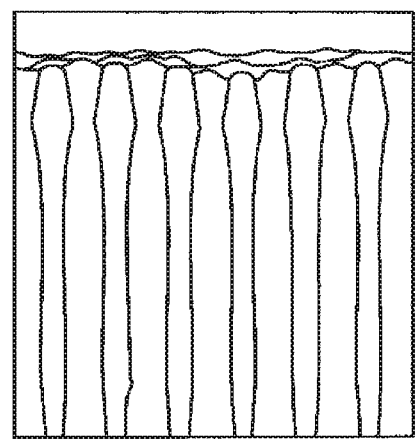
FIG. 5 is a view illustrating an experimental result of a change in the shape of the mask when the second gas is contained.

Here, experimental results of changes in the shape of the mask when the second gas is not contained in the processing gas and when the second gas is contained in the processing gas will be described. FIG. 4 is a view illustrating an experimental result of a change in the shape of the mask when the second gas is not contained. FIG. 5 is a view illustrating an experimental result of a change in the shape of the mask when the second gas is contained. FIG. 4 illustrates a sectional shape of the mask 203 when the second gas is not contained in the processing gas. FIG. 5 illustrates a sectional shape of the mask 203 when $H_2$ and $O_2$ as the second gas are contained in the processing gas.

Referring to the experimental results illustrated in FIGS. 4 and 5, when the second gas was not contained in the processing gas, the opening portion on the surface of the mask 203 was deformed so as to be clogged as illustrated in FIG. 4. In contrast, as illustrated in FIG. 5, when the second gas was contained in the processing gas, the shape of the mask was corrected by removing the deformed portion of the opening portion of the mask 203, and the shape of the mask was improved.

Referring back to FIG. 3, the control unit 50 determines whether or not a predetermined shape is obtained in the etching step (Step S103). When it is determined that a predetermined shape is not obtained (Step S103: No), the control unit 50 returns the processing to Step S101. In contrast, when it is determined that a predetermined shape is obtained (Step S103: Yes), the control unit 50 ends the processing.

That is, the control unit 50 stops the supply of the radio frequency power to the processing space 5 by controlling the first radio frequency power supply 42 and the second radio frequency power supply 44 after the wafer 27 is etched. Further, by controlling the DC voltage source 17, the control unit 50 applies, to the chuck electrode 16, a DC voltage whose polarity is opposite to the voltage applied when chucking the wafer 27. When the DC voltage having an opposite polarity is applied to the chuck electrode 16, the wafer 27 is neutralized and de-chucked from the electrostatic chuck 12. Furthermore, the control unit 50 opens the opening portion 7 by controlling the gate valve 3. The wafer 27 is unloaded from the processing space 5 of the chamber 1 through the opening portion 7.

Meanwhile, although the etching step and the correction step are simultaneously performed in the etching method described above, the disclosure is not limited thereto. For example, the correction step may be performed independently after the etching step is performed. Further, for example, the etching step and the correction step may be alternately repeated at least one or more times. Further, only the etching step may be performed first, and then, the correction step may be simultaneously performed while continuing the etching step. When the correction step is separated from the etching step in this manner, it is possible to suppress excessive reduction of the thickness of the mask 203 in the correction step.

As described above, according to the present embodiment, the silicon substrate 201 having the mask 203 formed on the first film 202 is prepared. The control unit 50 etches the first film 202 with the plasma generated from the first gas containing Xe, Kr or Rn so that the aspect ratio of the hole or the groove formed in the first film 202 becomes 30 or more. The control unit 50 corrects the shape of the mask 203 with the plasma generated from the second gas. In this way, the shape of the opening portion of the mask 203 deformed by heavy ions can be corrected. Further, since the ion impingement and the chemical reaction are separately performed when a rare gas is used, the independent controllability may be obtained. Furthermore, when the heavy ions are used, bending and/or distortion may be suppressed, and the shape of the bottom of the hole may be made favorable such as, for example, to be a rectangular shape.

Further, according to the present embodiment, the first film 202 contains a nitride. Further, according to the present embodiment, the first film 202 contains $Si_3N_4$ and/or $SiO_2$. In this case, a low-volatile film such as ammonium silicofluoride is generated at the bottom of the hole as an etching byproduct, but the film may be removed by the kinetic energy of heavy ions such as Xe. That is, the shape of the hole or the groove formed in the first film 202 may be improved.

Further, according to the present embodiment, the correction step is performed after the etching step. Further, according to the present embodiment, the etching step and the correction step are alternately repeated at least one or more times. As a result, it is possible to suppress an wear-out of the mask due to the shaving by the second gas.

Further, according to the present embodiment, the first gas contains at least one of Xe, $XeF_2$, $XeF_4$, $XeF_6$, $XeO_4$, $XeO_x$, $XeO_2$, $XeO_xY_y$, $XeO_xF_y$, $XeCl_2$, HXeOXeH, $XeH_2$, Kr, $KrF_2$, Rn, or $RnF_2$. As a result, the halogen may reach the inside of the hole or the groove, and the shape of the hole or the groove formed in the first film 202 may be improved.

Further, according to the present embodiment, the second gas contains at least one of $O_2$, $N_2$, $CO_2$, CO, $N_2O$, $NF_3$, $NH_3$, NO, $H_2$, or $Cl_2$. As a result, the shape of the mask 203 deformed by the heavy ions may be improved.

Further, according to the present embodiment, the mask is a film of C, W, Ti, TiN, $TiO_2$, or WC. As a result, the shape of the mask may be improved using an oxygen-containing gas, a nitrogen-containing gas, a hydrogen-containing gas, or $Cl_2$ gas.

Further, according to the present embodiment, the etching step and the correction step are performed under the condition that temperature of the substrate to be processed having the first film 202 is in a range of −70° C. to 100° C. As a result, the shape of the mask may be improved under the processing conditions where the etching rate is relatively high and the shape of the mask is easily deformed.

Although the case where a hole is formed on the first film 202 by the etching process has been described as an example in the embodiment described above, a groove may also be formed in the first film 202 by the etching process. Further, the first film 202 that is a material to be etched may be other than the silicon-containing substrate.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A method of etching comprising:
   providing a substrate having a mask formed on a first film;
   etching the first film through the mask with plasma generated from a first gas; and
   correcting a shape of the mask with plasma generated from a second gas,
   wherein the first gas contains Xe, Kr, or Rn, and an aspect ratio of a hole or a groove formed in the first film by the etching is 30 or more.

2. The method according to claim 1, wherein the first film contains a nitride.

3. The method according to claim 1, wherein the first film contains at least one of $Si_3N_4$ or $SiO_2$.

4. The method according to claim 1, wherein the correcting is performed after the etching.

5. The method according to claim 1, wherein the correcting is performed simultaneously with the etching.

6. The method according to claim 1, wherein the etching and the correcting are alternately repeated at least one or more times.

7. The method according to claim 1, wherein the first gas contains at least one of Xe, $XeF_2$, $XeF_4$, $XeF_6$, $XeO_4$, $XeO_x$, $XeO_2$, $XeO_xY_y$, $XeO_xF_y$, $XeCl_2$, HXeOXeH, $XeH_2$, Kr, $KrF_2$, Rn, or $RnF_2$.

8. The method according to claim 1, wherein the second gas contains at least one of $O_2$, $N_2$, $CO_2$, CO, $N_2O$, $NF_3$, $NH_3$, NO, $H_2$, or $Cl_2$.

9. The method according to claim 1, wherein the mask is a film of C, W, Ti, TiN, $TiO_2$, or WC.

10. The method according to claim 1, wherein the etching and the correcting are performed under a condition that temperature of the substrate including the first film is in a range of −70° C. to 100° C.

* * * * *